(12) United States Patent
Lim et al.

(10) Patent No.: US 11,409,689 B2
(45) Date of Patent: Aug. 9, 2022

(54) METHOD AND DEVICE FOR SENDING DATA ACCORDING TO A SIGNAL TIMING

(71) Applicant: Infineon Technologies AG, Neubiberg (DE)

(72) Inventors: Siak Pin Lim, Johor (MY); Govindraya Sanoor Prabhu, Singapore (SG); Tue Fatt David Wee, Singapore (SG); Hu Xu, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 197 days.

(21) Appl. No.: 16/867,884

(22) Filed: May 6, 2020

(65) Prior Publication Data
US 2020/0355743 A1    Nov. 12, 2020

(30) Foreign Application Priority Data

May 7, 2019    (DE) .......................... 102019111881.6

(51) Int. Cl.
*G06F 13/42*    (2006.01)
*G01R 31/319*    (2006.01)
*H04W 24/08*    (2009.01)

(52) U.S. Cl.
CPC ... *G06F 13/4282* (2013.01); *G01R 31/31907* (2013.01); *G01R 31/31908* (2013.01); *G01R 31/31922* (2013.01); *G06F 13/42* (2013.01); *G06F 13/4286* (2013.01);
(Continued)

(58) Field of Classification Search
CPC .. G06F 13/4282; G06F 13/42; G06F 13/4286; G06F 13/4291; G06F 13/4295; G01R 31/31907; G01R 31/31908; G01R 31/31922; G01R 31/318371; H04W 24/08;
(Continued)

(56) References Cited

U.S. PATENT DOCUMENTS

2004/0109443 A1* 6/2004 Gai ...................... H04L 69/161
370/389
2004/0215856 A1   10/2004 Leduc et al.
(Continued)

OTHER PUBLICATIONS

Lee et al., "A measurement-based admission control algorithm using variable-sized window in ATM networks," Proceedings of ICICS, 1997 International Conf on Information, Com. and Signal Processing. Theme: Information Systems Engineering and Wireless Multimedia Com. Singapore, 1997, pp. 378-384 vol. 1 (Year: 1997).*

(Continued)

*Primary Examiner* — Cynthia Britt
(74) *Attorney, Agent, or Firm* — Banner & Witcoff Ltd.

(57) ABSTRACT

A device of a data testing environment including a node configured to connect the device to a tester; one or more processors configured to receive from the node an electrical signal alternating between at least a first state and a second state, the first state representing a data transmission trigger and the second state representing a data transmission opportunity; determine a timing of the data transmission opportunity based on the received electrical signal; and send data to the node during the data transmission opportunity in response to receiving the data transmission trigger.

20 Claims, 9 Drawing Sheets

(52) U.S. Cl.
CPC ...... *G06F 13/4291* (2013.01); *G06F 13/4295* (2013.01); *H04W 24/08* (2013.01)

(58) Field of Classification Search
CPC ... H04L 7/0008; H04L 7/0079; H04L 7/0091; H04L 7/06
See application file for complete search history.

(56) References Cited

U.S. PATENT DOCUMENTS

| | | | | |
|---|---|---|---|---|
| 2014/0187287 | A1* | 7/2014 | Medapalli | H04W 72/1215 455/553.1 |
| 2016/0179427 | A1* | 6/2016 | Jen | G06F 3/0625 711/147 |
| 2016/0381661 | A1* | 12/2016 | Zhao | H04W 76/14 370/329 |

OTHER PUBLICATIONS

German Patent Office, Office Action issued for DE 102019111881.6, 6 pgs., dated Apr. 28, 2020.

* cited by examiner

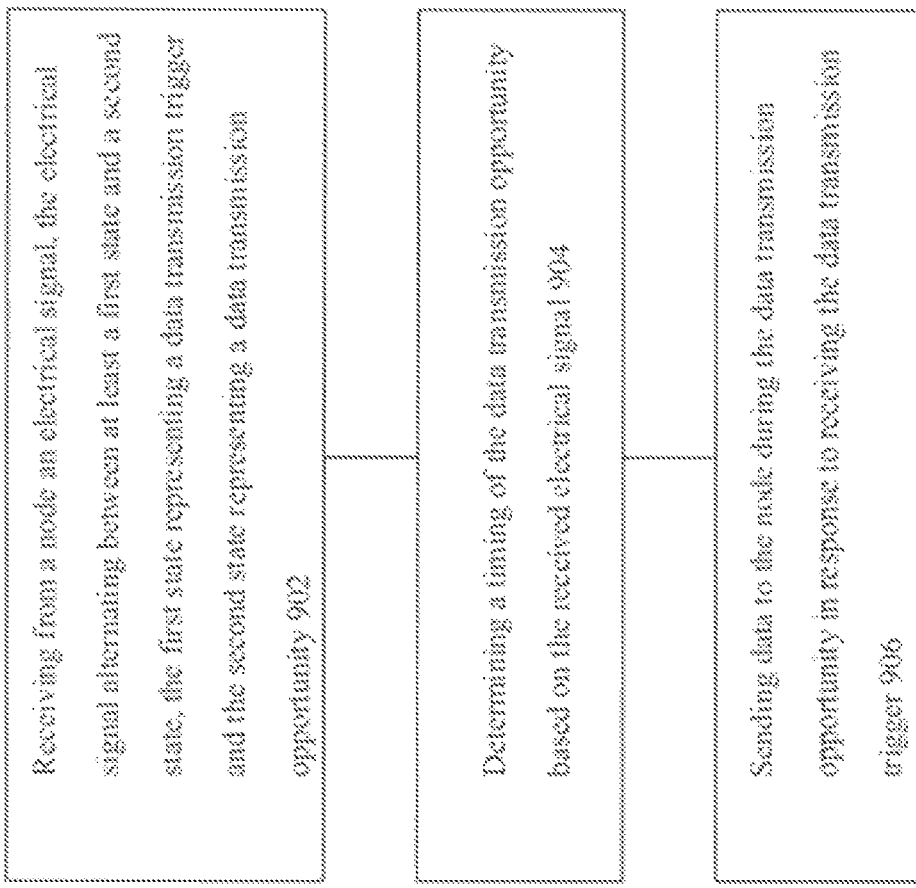

METHOD AND DEVICE FOR SENDING DATA ACCORDING TO A SIGNAL TIMING

TECHNICAL FIELD

Various embodiments relate generally to the transfer of data between asynchronous elements, such as, for example, Automatic Test Equipment ("ATE") and a Device Under Test ("DUT").

BACKGROUND

Devices may communicate with one another using any of a variety of protocols and communication resources. During some types of inter-device communication, only one wire may be available for communication between the devices, or it may otherwise be desirable to use only one wire for such communication. This may occur, for example and without limitation, during communication between an ATE and a DUT.

In some circumstances, the two devices may operate asynchronously. That is, each device may be equipped with one or more processors operating according to one or more local oscillators. Although various protocols exist to synchronize asynchronous devices, such synchronous operation tends to be only temporary, as the processor clocks of each device tend to drift apart from one another after synchronization is complete. As the processor clocks drift from one another, transfer of data between processors may become increasingly impaired.

Various efforts have been made to address the issue of drift between asynchronous devices. According to one known method, an ATE may be configured with a large buffer and a robust processor that may be capable of subsequent analysis of asynchronously received data from the DUT to detect the received data transmission. Test patterns may be executed on the ATE processors, and a suitable strobe position may be determined through experimentation, such as by shmooing the test pattern in a Schmoo plot. The selection of an ideal strobe point for individual patterns according to this known method is a tedious and processor-demanding task. As such, the buffers and/or processors required for such operations may be costly or otherwise undesirable for a given implementation. Accordingly, a simpler method that can be performed on a less-powerful processor is desired.

It is also known to engage in a repeated synchronization protocol to reestablish sufficient synchronization for data transfer. Such synchronization protocols may require a comparatively lengthy negotiation between the two devices, but may only result in brief periods of adequate synchronization. Even upon establishing a suitable degree of synchronization, the clocks of the two devices will tend to drift apart from one another, thereby quickly requiring resynchronization. This requires dedication of a significant overhead to the synchronization protocol compared to the amount of data that can be transmitted as a result.

Other known attempts to enable synchronous communication between an ATE and a DUT with asynchronous clocks have required the use of additional wires for transmission of synchronization signals, such as a first wire for data transmission and a second wire for clock transmission. Given that many devices have only a single input/output port for data transfer, this may be an impracticable or undesirable solution.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 9 depicts a method of single-wire synchronization according to an aspect of the disclosure.

DESCRIPTION

Figure 1:
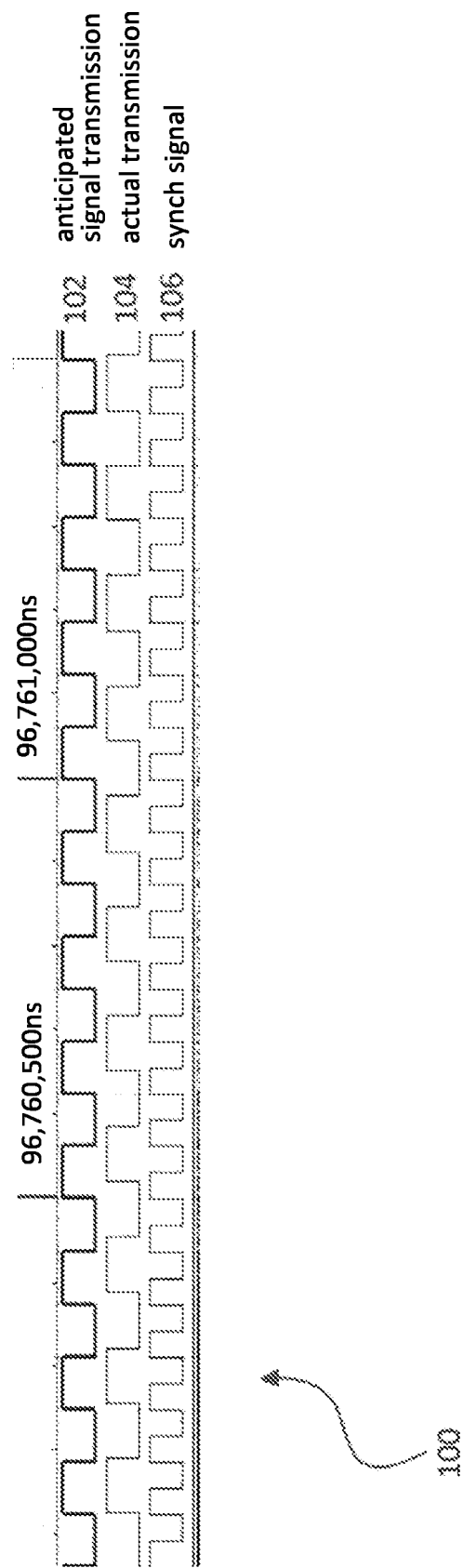
FIG. 1 depicts clock drift in a testing protocol between an ATE and a DUT.

The following detailed description refers to the accompanying drawings that show, by way of illustration, specific details and aspects in which the disclosure may be practiced. These aspects are described in sufficient detail to enable those skilled in the art to practice the disclosure. Other aspects may be utilized and structural, logical, and electrical changes may be made without departing from the scope of the disclosure. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The word "exemplary" is used herein to mean "serving as an example, instance, or illustration." Any embodiment or design described herein as "exemplary" is not necessarily to be construed as preferred or advantageous over other embodiments or designs.

Throughout the drawings, it should be noted that like reference numbers are used to depict the same or similar elements, features, and structures.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term data, however, is not limited to the aforementioned examples and may take various forms and represent any information as understood in the art.

The term "processor" or "controller" as, for example, used herein may be understood as any kind of entity that allows handling data, signals, etc. The data, signals, etc. may be handled according to one or more specific functions executed by the processor or controller.

A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "system" (e.g., a drive system, a position detection system, etc.) detailed herein may be understood as a set of interacting elements, the elements may be, by way of example and not of limitation, one or more mechanical components, one or more electrical components, one or more instructions (e.g., encoded in storage media), one or more controllers, etc.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit ("CPU"), Graphics Processing Unit ("GPU"), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions which will be described below in further detail may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory ("RAM"), read-only memory ("ROM"), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

An ATE may be any device that is used to perform a test on a second device, commonly known as a DTE. ATEs may range from simple to complex computing devices and may contain a plurality of complex testing instruments, whether real or simulated. ATEs may be capable of automatically testing and/or diagnosing faults in sophisticated electronic devices. Such sophisticated electronic devices may include, but are not limited to, packaged parts, wafer testing, systems on chips, and integrated circuits.

An ATE may be configured to receive test information from a DUT. The ATE and the DUT may each be configured with processors that operate asynchronously with respect to one another. Such asynchronous communication may create certain challenges with respect to transfer of data. Even in circumstances where synchronous communication is achieved, such as through the use of a synchronization protocol, the two processors are very likely to quickly drift apart, thereby requiring additional synchronization efforts.

The problem of synchronization between an ATE and a DUT may be relevant in certain testing situations. The application mode testing for such equipment generally imposes an asynchronous communication protocol to ensure full verification of certain specifications. A single wire interface is typically used for communication between the ATE and the DUT, and many ATEs and/or DUTs are configured with only a single input/output port for such communication. The native test clock of the ATE is typically out of phase and frequency to the clock of the DUT, which creates difficulty in sampling DUT data. In light of the foregoing, it is desired to provide reliable test mechanism that allows the DUT to synchronize a transmission packet to ATE clock along a single wire interface. It is desired to implement this procedure such that one or more existing single wire interface protocols can continue to be used. It is further desired to carry out the procedure in ways that permit use with a variety of testers, including testers with comparatively small buffers and/or a variety of processor qualities.

Data transmitted by the DUT is generally synchronous to the DUT clock. Even in circumstances in which the DUT and the ATE are synchronized, the DUT clock will be expected to experience drift, such as drift due to its manufacturing process or variations in temperature. In a typical implementation, approximately two bytes of data can be reliably strobed by the ATE before synchronization deteriorates sufficiently to markedly impaired data transfer. Various tactics have been used to attempt to improve this limited amount of data transfer, such as setting strobe points toward the end of the ATE clock cycle when the clock frequency is lower than the ATE clock, or setting the strobe to the beginning of the ATE clock if the DUT clock is faster than the ATE clock. Even when these measures are taken, any significant clock drift is likely to result in yield loss.

ATEs may have a wired or wireless connection to the DUT. In relevant part, the ATE may have a wired connection to the DUT. This wired connection may comprise a single wire or more than one wire. The methods and principles described herein are intended to be performable on an ATE-to-DUT connection consisting of one wire. This notwithstanding, the methods and procedures described herein may alternatively or additionally be performed in testing scenarios involving two or more wires.

The one wire testing environment may be preferable in various applications, as the use of a single wire may reduce a number of interface signals, and thereby require a lower pin count, offer a higher density, and typically require less power. In such one-wire testing scenarios, the one wire and a reference ground may be used. These one wire testing implementations may be configured unidirectionally, bidirectionally and/or in a half-duplex mode with bidirectional transmission over a single wire. Additional signals may be employed for hardware handshakes as required. Single wire testing may be configured to exploit any of signal amplitude, signal frequency, or signal phase, whether in isolation or in combination with two or more properties. The testing may occur in a unicast, multicast, or broadcast configuration, or any combination thereof.

The testing configuration may involve a training sequence. The training sequence may comprise any number of complementary bits. The training sequence may provide a fixed reference period between two falling edges of a signal, thereby permitting calibration of the DUT timing to the actual transmission speed.

Concepts for methods and devices for device testing are disclosed herein. In order to perform device testing, a synchronization pulse may be embedded in a communication protocol generally during a period when a data transmission is expected from the DUT. The synchronization pulse may comprise at least two portions, such as a low portion and a high portion, or a non-portion and off-portion. The DUT and the ATE may be configured to use the synchronization scheme as described herein, such as implementing, recognizing, adjusting, and performing according to the synchronization scheme.

FIG. 1 demonstrates the effective clock drift in a testing protocol 100 between an ATE and a DUT. In this figure, three signals are shown. The top signal represents an anticipated signal transmission 102 from the DUT to the ATE. The middle signal indicates an actual transmission 104 from the DUT to the ATE. The third signal is a clock signal based on the clock of the ATE. As demonstrated by this figure, the initial transmission demonstrates a high degree of synchronicity, as the beginning of the anticipated transmission 102 and the beginning of the actual transmission 104 are essentially the same. The repeated pattern of anticipated transmission 102 and actual transmission 104 continue but become, with each successive veneration, more displaced with respect to one another. That is, although the anticipated transmission 102 remains constant, the actual transmission 104 drifts to the right with respect to the anticipated transmission 102. Otherwise stated, the actual transmission 104 begins to drift longer compared to the anticipated transmission 102. As can be seen in this figure, after approximately ten iterations, the actual transmission 104 has drifted sufficiently far to the right that it is constructively opposite the anticipated transmission 102.

Figure 2:
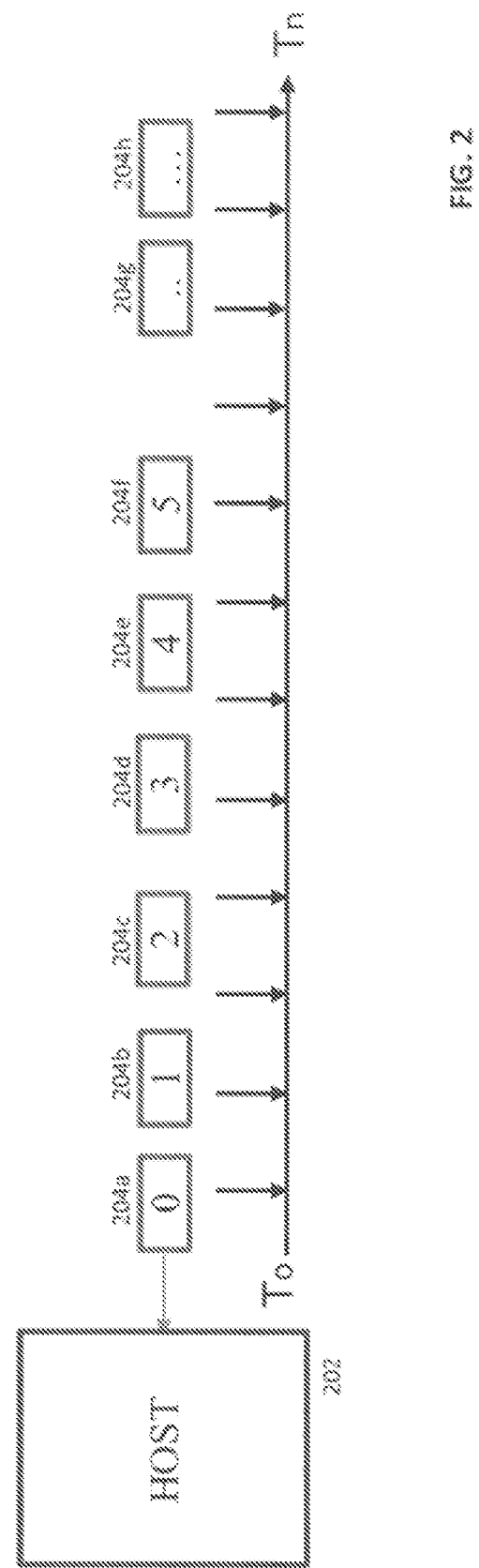
FIG. 2 shows the transmittal of asynchronous data to a host ATE.

FIG. 2 shows the transmittal of asynchronous data to a host ATE. In a conventional testing situation, the clock of the DUT controls the timing of the transmission from the DUT to the ATE 202. Because the clock of the DUT is prone to drift with respect to the clock of the ATE, the DUT experiences a transfer drift, during which it transmits packets of data asynchronously with respect to the ATE. In this case, for example, data packets 204a-204h are transmitted asynchronously from the DUT to the ATE 202. The data packets 204a-204h are spaced unevenly to demonstrate the changing asynchronous transmission associated with DUT clock drift.

Much of the asynchronous transmission due to clock drift can be accounted for and corrected by equipping the ATE 200 to with a high-end processor and large buffer, and by employing one or more strategies to detect a clock count from the received data. In this configuration, the ATE 202 collects the asynchronous received transmissions and subsequently analyzes them to detect the received data. Even with this method, data loss cannot be excluded. Moreover, this requires significant processor-power and a large buffer. This translates into more expensive processors, which ultimately increases the cost of the ATE 202.

Figure 3:
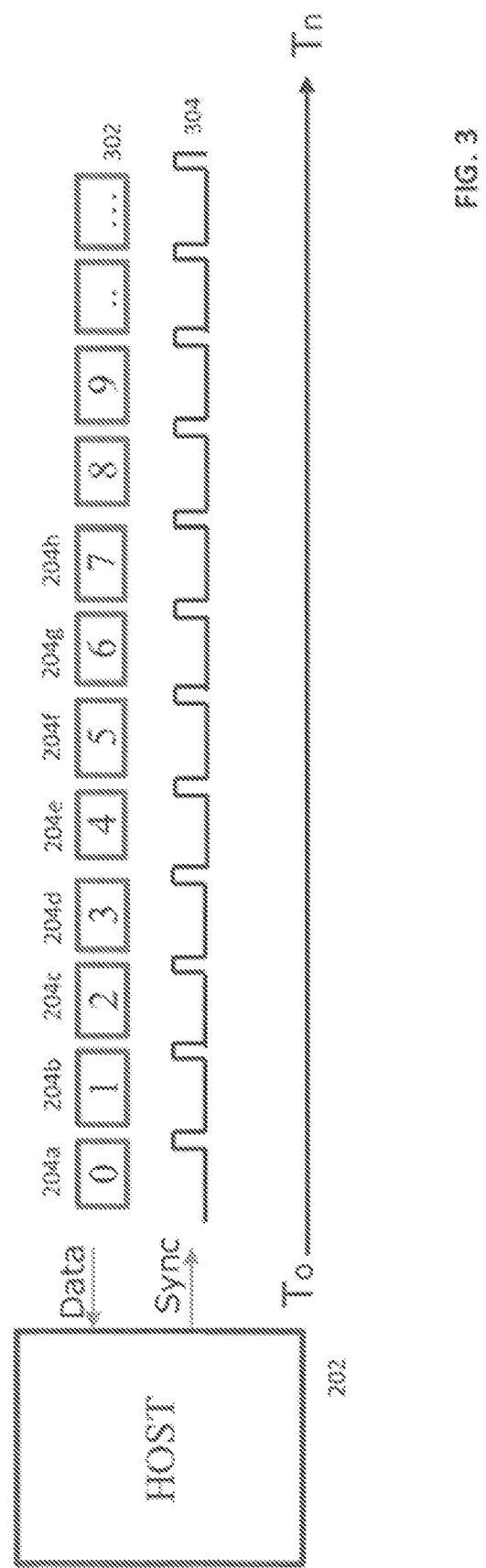
FIG. 3 depicts a known method for transmitting a synchronization signal from the ATE to the DUT using an additional conductor to transmit a clock signal.

FIG. 3 depicts a known method for transmitting a synchronization signal from the ATE 202 to the DUT using an additional wire. In this case, the host 202 is connected to the DUT via at least two wires. A first wire 302 is used for data transmission of data packets, as depicted by numerals 204a through at least 204h. The second wire 304 is used to transmit a synchronization signal. The DUT may be configured to receive the synchronization signal as transmitted on 304 and to transmit data packets in response to, or in accordance with, the received synchronization signal. In this case, the data packets are transmitted along a different wire from the synchronization signal. According to this method, it may not be necessary to strictly alternate between data transmission and synchronization signal transmission, as they occur on different wires and will likely not affect one another. Nevertheless, the requirement to have an additional wire necessitates additional processor resources, which may be undesirable. Moreover, many ATEs and/or DUTs are configured to operate with a single input/output conduction and would not be capable of introducing a second conductor for transmission of a synchronization signal.

Figure 4:
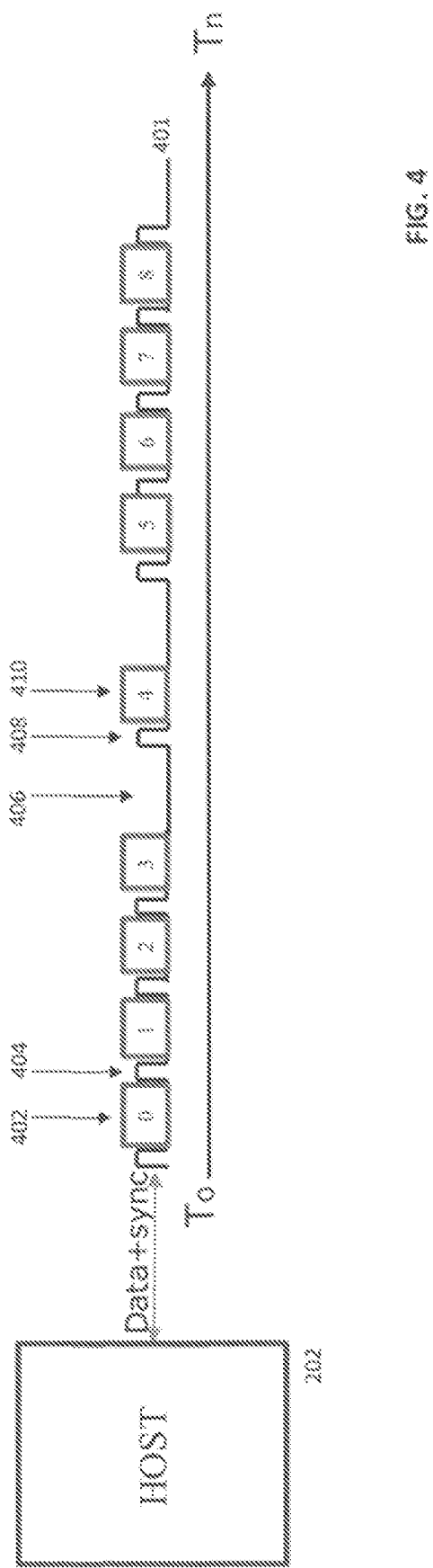
FIG. 4 shows a data transfer scheme with synchronization signal.

FIG. 4 shows a data transfer scheme with synchronization signal according to an aspect of the disclosure. In this manner, the ATE 202 is connected to the DUT via a single wire 401, along which a synchronization signal (as depicted by at least 404 and 408) is transmitted from the ATE 202 to the DUT, and one or more data packets (as depicted by at least 402 and 410) are transmitted from the DUT to the ATE 202. The DUT may be configured to transmit data packets in response to a received synchronization signal. For example, data packet 402 is transmitted in response to the preceding synchronization signal. Data packet 402 is followed by an additional synchronization signal 404, which is followed by a next data packet. In this manner, the synchronization signals fulfill at least two purposes. First, the synchronization signals provide a means of synchronization between the ATE 202 clock and the DUT clock. Because the synchronization signals are transmitted by the ATE 202, they represent a timing of the ATE 202 clock and therefore provide a means for the DUT to transmit signals synchronously with the clock of the ATE 202. Second, these synchronization signals function as a prompt or request for data transmission. In this manner, the ATE 202 may seek and pause data transmission through its synchronization signals. In the course of receiving data, the ATE 202 may be required to temporarily direct its processing resources to another task. Such other tasks could be data processing, buffer analysis, interrogation of an additional device, or otherwise. In any of these circumstances, it may be desirable for the ATE 202 to temporarily pause receipt of data packets. In this manner, the ATE 202 may easily suspend the DUT's transmission of data packets by ceasing to send the synchronization signal. Such a period is depicted by 406, in which the ATE 202 has elected to temporarily suspend sending the synchronization signal. Based on the pattern established with data packets 0 through 3 and their corresponding synchronization signals, it would be expected for the ATE 202 to send a synchronization signal immediately after data packet 3, which would be immediately followed by one or more additional data packets in the space denoted by 406. However, because the ATE 202 has not sent a synchronization signal in this period, the DUT has also not sent a corresponding data packet. In this manner, the ATE 202 is able to control the DUT to send, or to suspend sending, data packets for testing. When the ATE 202 is able to resume receiving data packets, the ATE may send a synchronization signal 408 to prompt the DUT to transmit a data packet 410. As is depicted herein, the ATE 202 may, in this manner, direct the DUT to send packets at any time or frequency that is suitable for ATE 202 testing.

Figure 5:
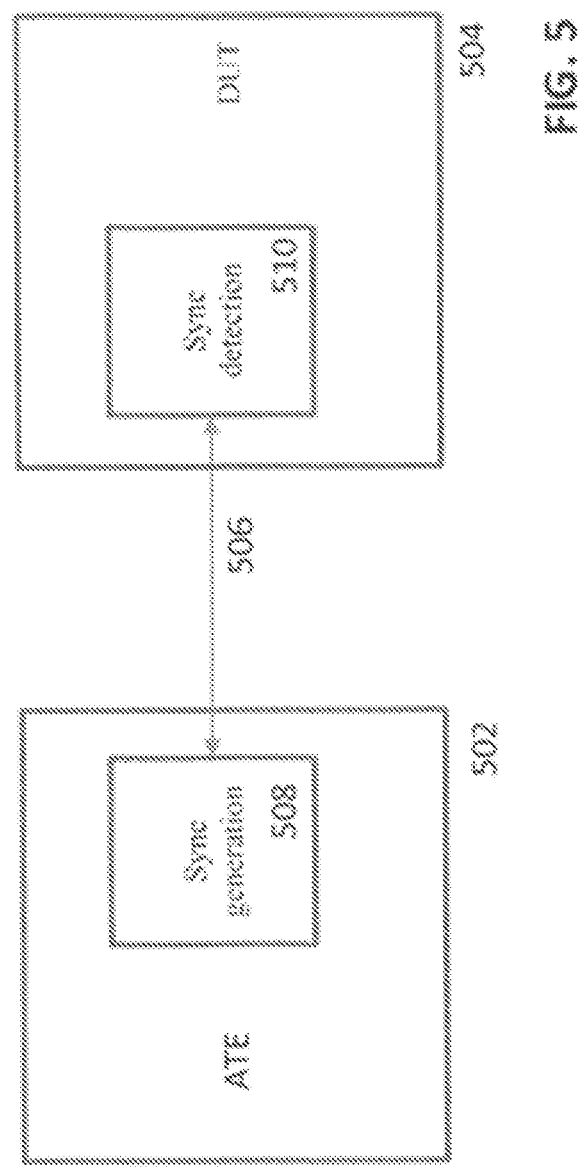
FIG. 5 shows an ATE connected to a DUT and a single wire connection.

FIG. 5 shows an ATE 502 connected to a DUT 504 and a single wire connection 506. The ATE 502 comprises a synchronization generation circuit 508, and the DUT 504 comprises a synchronization detection circuit 510. In this manner, the ATE 502 generates a synchronization signal in the synchronization generation circuit 508 and transmits the synchronization signal over the single wire 506 to the DUT 504. The synchronization signal is received by the DUT 504 and detected by the synchronization signal detection circuit 510. In response to the detected synchronization signal, the DUT responds with transmission of data packets over the single wire 506 on which the synchronization signal was sent. The transmission of data packets from the DUT 504 to the ATE 502 is performed at a frequency corresponding to the detected synchronization signal. Furthermore, the transmission of data packets is performed in response to the received data synchronization signal, such that the transmission of data packets can be triggered by transmission of the synchronization signal from the ATE 502 to the DUT 504, and the transmission of data packets can be paused or ceased by pausing or ceasing the transmission of the synchronization signal from the ATE 502 to the DUT 504. According to another aspect of the disclosure, the ATE may be configured with one or more processors, which may be configured to perform any of the functions described herein, including but not limited to, the functions performed by the synchronization generation circuit 508 and/or the sending of the synchronization signal. According to another aspect of the disclosure, the DUT may be configured with one or more processors, which may be configured to perform any of the functions described herein, including but not limited to, the functions performed by the synchronization detection circuit 508 and/or the sending of the data in response to the synchronization signal.

Figure 6:
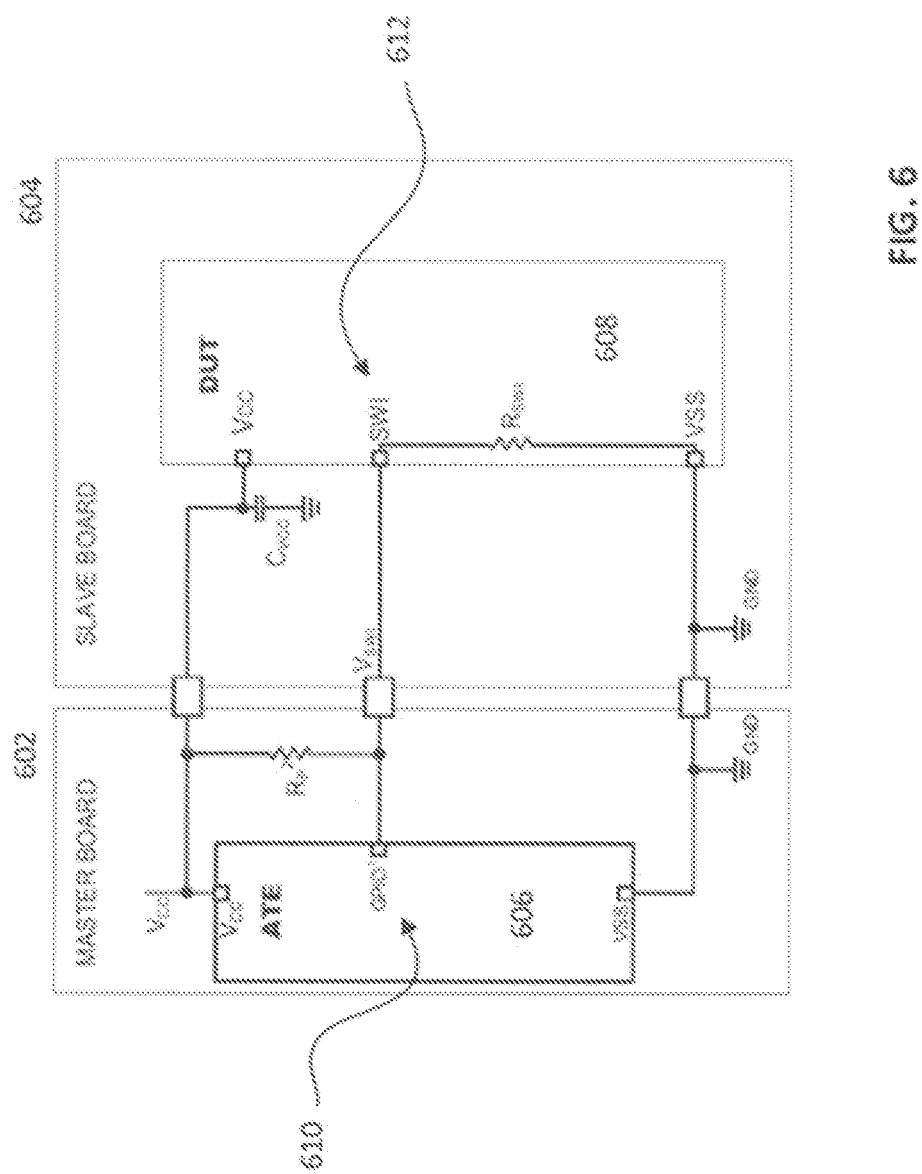
FIG. 6 depicts a circuit configuration of a master board and slave board, according to one aspect of the disclosure.

FIG. 6 depicts a circuit configuration of a master board 602 and slave board 604, according to one aspect of the disclosure. In this manner, the master board 602 comprises the ATE 606, and the slave board 604 comprises the DUT 608. The ATE is configured with a single input/output pin 610, which is connected across a single wire to the single input/output pin 612 of the DUT 608. In this manner, the synchronization signal is transmitted from pin 610 to pin 612, and the data packets are transmitted from pin 612 to pin 610. Because many ATE devices are configured with a single input/output pin, and because many DUT devices are configured with a single input output pin, the ability to transmit a synchronization signal and data packets on the same wire allows the use of the improved synchronization methods described herein with existing pin and device configurations.

Figure 7:
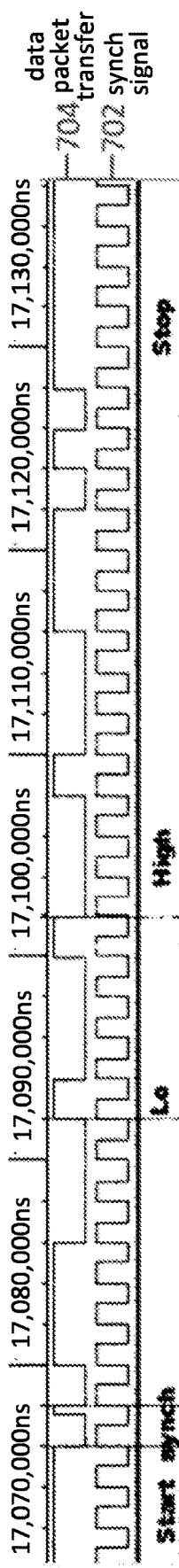
FIG. 7 depicts data packet transfer in response to a synchronization signal according to another aspect of the disclosure.

FIG. 7 depicts data packet transfer 704 in response to a synchronization signal 702. The synchronization signal 702 may be an internal processing clock of the ATE, to which the synchronization pulse is synchronized. As depicted herein, the one or more processors of the DUT may be configured to begin transmitting the data packet in accordance with a stopping time or leading trail of the synchronization signal. In the conventional approach, it may be known to use a second pin/wire to transmit the synchronization signal.

Figure 8:
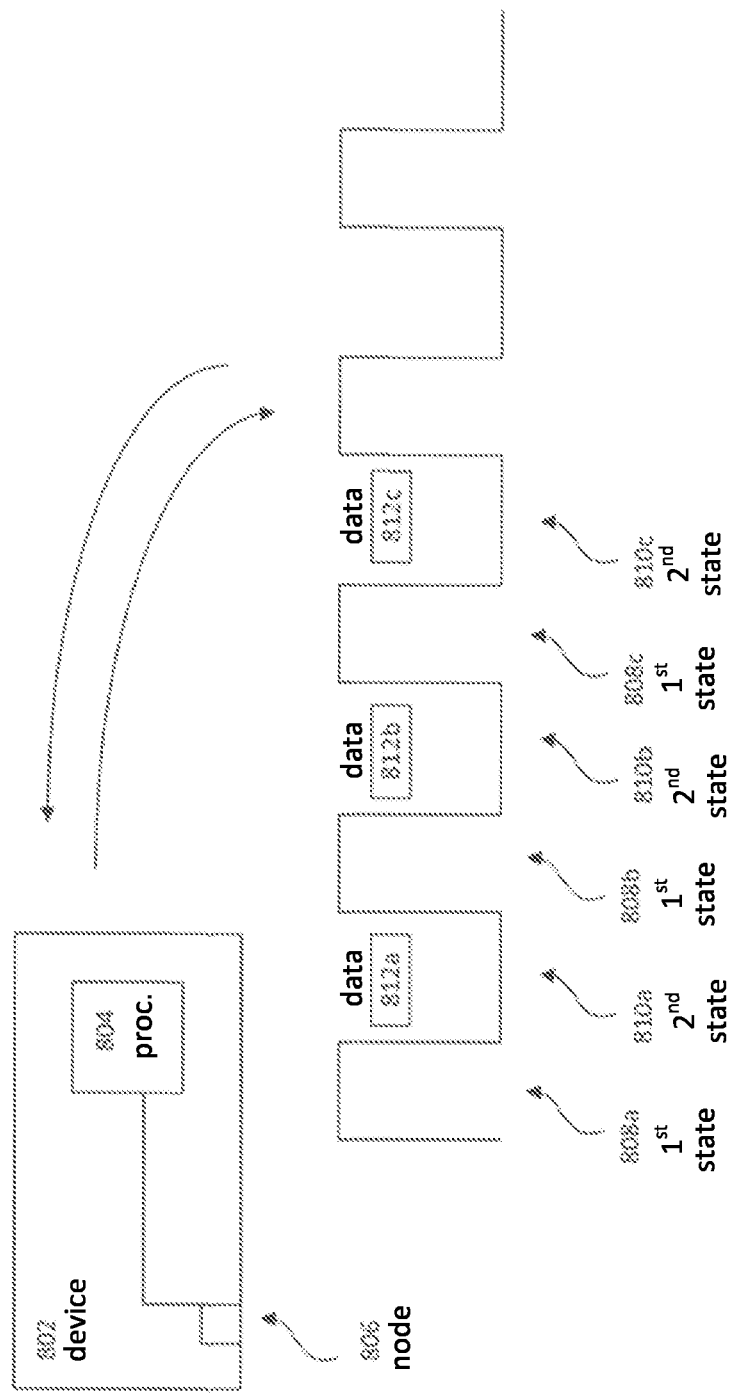
FIG. 8 depicts data packet transfer in response to a synchronization signal according to another aspect of the disclosure.

FIG. 8 depicts a device 802 according to an aspect of the disclosure. The device may be used in a data testing environment, such as a device to be tested by an ATE. The device may comprise a node 806 and one or more processors 804, the one or more processers being configured to receive from the node an electrical signal, the electrical signal alternating between at least a first state 808a, 808b, 808c and a second state 810a, 810b, 810c according to a predetermined signal timing, the first state representing a data transmission trigger and the second state representing a data transmission opportunity; and where there one or more processors are further configured to determine a timing of the second state based on the predetermined signal timing; and send data 812a, 812b, 812c to the node during the second state in response to receiving the signal according to the first state.

The first state and the second state may be differentiated based on a change in any signal characteristic. Examples of changes in signal characteristics may include, but are not limited to, a change in amplitude, a change in frequency, and/or a change in phase. The change in signal characteristic may allow the signal to switch between a high state and a low state. The first state may correspond to a high state or a low state, and the second state may correspond to the other of the high state or the low state.

According to one aspect of the disclosure, the first state and second state may correspond to an on or off. That is, in the event that the first state is the on state, the signal may switch between having a characteristic that is above a predetermined threshold or being off. In this configuration, the second state, which corresponds to a sending opportunity, may be absent a signal transmission from an external device. In this manner, it is anticipated that the only transmission on the shared wire or to the shared node, if any, that occurs during the second state would be the sending of data by the device.

According to another aspect of the disclosure, the second state may correspond to a low signal. That is, the signal may alternate between high and low, and an external device, such as the ATE, sends a low signal during the second stage. In this manner, the sending of data by the DUT must be configured to be readable to the ATE when the ATE concurrently sends a signal over the same wire.

Because both the first signal state and the sending of data occur on the same wire, the sending of data may occur within all or less than all of the second signal state. That is, the one or more processors may be configured to send data during all or essentially all of a duration corresponding to the second stage. Alternatively, the one or more processors may be configured to send data during a period corresponding to less than all of the second stage. In this manner, the second stage may be an opportunity to send data during a duration of any length that is less than the duration of the second stage. In this manner, the duration of the second stage may be selected based on the benefits and tradeoffs with respect to the configuration of the first stage and the second stage. For example, the longer the second stage is, the more data can be sent, and the less likely it is that the DUT will send data concurrently with a first state transmission. On the other hand, the longer the second stage, the less relationship the second stage has with the first stage, which fulfills synchronizing function. That is, although the synchronization signal corresponds with a clock of the ATE and thus may serve as a basis to temporarily synchronize a transfer of the data from the DUT to the ATE, the longer the second stage, the more opportunity for drift or other synchronization-destabilizing factors to occur.

FIG. 9 depicts a method of data transfer comprising receiving from a node an electrical signal, the electrical signal alternating between at least a first state and a second state, the first state representing a data transmission trigger and the second state representing a data transmission opportunity 902; determining a timing of the data transmission opportunity based on the received electrical signal 904; and sending data to the node during the data transmission opportunity in response to receiving the data transmission trigger 906.

As stated herein, the transmission of data packets by the DUT may be triggered by a pulsed synchronization signal, as transmitted from the ATE. These synchronization signals may be pulsed at a predetermined interval that corresponds with the test clock of the ATE and/or at a rate selected according to a processing speed and/or buffer capacity of the DUT. The data transmission from the DUT may be transmitted to correspond to the synchronization signal. The synchronization signal may serve as an invitation or trigger event for the DUT to send its data packets in a burst mode following the test cycles. The data strobe may be aligned to the falling edges of the ATE test clock (ate_clk), which may be the midpoint of the tester cycle.

A digital verification test bench may be operated as a combination of a single-wire interface host model and the DUT, connected mutually. The host model may comprise a single-wire interface driver that initiates a synchronization pulse when it is desired to trigger transmission of a packet by the DUT. Rather than the DUT transmitting one or more data packets corresponding to the clock of the DUT, or otherwise corresponding to a timing of the DUT, the ready data in this synchronized configuration may be sent upon receiving the pulsed signal. The host model may be configured to send the synchronization signal to trigger transmission of data packets. The host model may be configured to initiate the synchronization signal upon determination that the DUT is ready to begin transmission. In performing data transmission according to the synchronization signal as described herein, the DUT remains single-wire interface compliant and is thus able to utilize known protocols for data transfer.

The logic for performing the methods and procedures as described herein may be software-based and/or hardware-based. That is, the ATE may comprise one or more circuits that are configured to generate and send the synchronization signal as a prompt for receiving data transmissions from the DUT. Similarly, the DUT may comprise one or more circuits that are configured to receive and detect the synchronization signal, and to send data packets in response to the detected synchronization signal. Additionally or alternatively, these functions may be carried out by processing instructions, which cause one or more processors in the ATE and/or the DUT to carry out the methods and procedures described herein.

The methods and procedures described herein may be performed in existing testing devices with little modification. It is expressly anticipated that the methods and procedures described herein may be performed by utilizing existing protocols for device testing, such as, for instance, a single-wire interface protocol, and thereby permitting transmission of the synchronization signal and transmission of the corresponding data packets for testing on the same wire.

The methods and procedures described herein may be performed using two devices, an ATE and a DUT, having clocks that are asynchronous to one another. Because the synchronization signal is generated in accordance with a timing of the clock of the ATE, the synchronization signal is synchronized to, or otherwise corresponds with, the ATE. In receiving the synchronization signal and detecting same, the DUT receives a regular input corresponding to the ATE clock. This enables the DUT to transmit data packets in accordance with a clock setting of the ATE, without the necessity to engage in repeated traditional synchronization procedures.

The synchronization signal may comprise a plurality of pulses. The pulses may be of any duration and/or any frequency whatsoever. It is generally anticipated, however, that the pulses be regular. That is, that a frequency and a duration of the first signal portion is generally constant, and that a frequency and a duration of the second signal portion is generally constant, except for when the pulse is discontinued by the ATE because no data transmission from the DUT is desired. The duration and/or frequency may be determined by the ATE, the DUT, or a combination of the two. According to one aspect of the disclosure, the duration and/or frequency of the synchronization signal may be negotiated in a handshake operation between the ATE and the DUT. The duration and/or frequency of the synchronization signal may be selected based on any factors including, but not limited to, a processing speed of the ATE, a processing speed of the DUT, a buffer capacity of the ATE, a transmission capacity of the DUT, a number of DUT is connected to the ATE, or otherwise.

The synchronization signal may comprise a plurality of pulses, each pulse comprising a first signal value of a first duration and a second signal value of the second duration. According to one aspect of the disclosure, the first signal value and the second signal value may be high signal value and a low signal value, respectively. The low signal value may be a signal value of a magnitude less than the high, or zero. The first signal value and the second signal value may be configured according to any known methods of representing a high and the low.

The synchronization signal may be transmitted from the ATE to the DUT. The transmission may occur according to an existing interface. The synchronization signal may be transmitted according to a single input/output interface of the ATE and may be transferred to a single input/output interface of the DUT. Similarly, the transmission of data packets may be transferred from these single input/output of the DUT to the single input output of the ATE. The ATE and the DUT may be connected for purposes of transmission of the synchronization signal and the data packets by a single-wire. In this manner, both the synchronization signal and the data packets may be transmitted along the same wire, whether in an alternating fashion, simultaneously, and/or concurrently.

The transmission of beam synchronization signal and the data packets may be performed according to any known or unknown protocol. According to one aspect of the disclosure, the transfer of the synchronization signal and the one or more data packets may occur according to a single-wire interface protocol.

The DUT may be configured with one or more circuits and/or processors which are configured to receive the synchronization signal and to detect a timing of the synchronization signal.

According to an aspect of the disclosure, the procedures described herein may ease test pattern processing. When the transmission data transfer processes are duly synchronized to the ATE test clock, the wave sets may be minimized to as low as one. As described herein, the test pattern process may use only two wave sets, one wave may be used for the synchronization pulse, and the other wave may be used for data transaction. The decreased number of waves permits the use of simpler processors and lower-cost testing options while maintaining high parallelism.

According to another aspect of the disclosure, by utilizing the synchronization pulse as the stimulus for transmission of data packets, communication between the ATE and the DUT may be performed with increased efficiency, as one or more request for data may be eliminated, said request being replaced by a synchronization signal. The DUT may be configured to interpret the synchronization signal and to transmit data in response to bursts.

According to another aspect of the disclosure, the DUT may be configured to detect the presence of the synchronization signal. It is anticipated that the DUT may be configured to operate according to the methods described herein, and also according to a conventional testing pattern without the synchronization signal. In this manner, the DUT may be configured to detect the presence of a synchronization signal as described herein. When the synchronization signal is present, the DUT may be configured to respond with data packets in the manner described herein. When the synchronization signal is absent, the DUT may be configured to transmit data packages according to another known method.

Compared to the two-wire method of DUT testing, in which a strobed signal is transmitted on a different wire than the testing data, a single-wire may require additional signal-management steps to ensure that the data can be appropriately received. In the two-wire configuration, the strobe will generally not interfere with the data transmission, regardless of the timing of the data transmission, since the transmissions are isolated on different wires. Of course, this configuration requires at least two input/output interfaces and a more robust processor, which may be undesirable. When the two signals are transmitted on the same wire, however, it may be necessary to plan the signals such that the data transmission and the strobe do not overlap. This is achieved herein by configuring the DUT to assess the received strobed signal for the first state and the second state, and to transmit data only in a time corresponding to the anticipated transmission of the second state.

The ATE and/or the DUT may be configured to provide for on-demanding testing data. That is, the ATE may be required to dedicate its processing resources to another device or task, and as such, the ATE may not desire to receive data from the DUT. The ATE can, in this situation, simply cease sending the first state of the signal. The DUT is configured to send data in response to receiving the first state of the signal, and therefore when the first state of the signal is not sent, the DUT is configured not to send data during the time corresponding to the second state. In this manner, the ATE creates an on-demand data request scenario. When the ATE desires to receive data again, the ATE may resume sending the signal according to the first state, and in so doing, prompt the DUT to resume sending data.

The methods and procedures described herein may be understood, according to one aspect of the disclosure, as a departure from a data strobe encoding mechanism. In data strobe encoding, it is known for a device to transmit a data stream over a first wire and a strobe over a second wire, the strobe being configured to be XOR combinable with the data stream to yield a transmission representing the clock signal of the transmitting device. Under this configuration, the derivable clock signal corresponds to the clock signal of the device that is also transmitting the data stream. According to the methods and principles described herein, however, the clock signal is transmitted to the device that transmits its data stream, from the device that is configured to receive the data stream.

Admission will aspects of the disclosure are described in the following examples.

In Example 1, a device for use in a data testing environment is disclosed comprising a node, to connect the device to a testing device; one or more processors, the one or more processers configured to: receive from the node an electrical signal, the electrical signal alternating between at least a first state and a second state, the first state representing a data transmission trigger and the second state representing a data transmission opportunity; determine a timing of the data transmission opportunity based on the received electrical signal; and send data to the node during the data transmission opportunity in response to receiving the data transmission trigger.

In Example 2, the device for use in a data testing environment of Example 1 is disclosed, wherein the first state and the second state are differentiated by a change in a signal property of the electrical signal.

In Example 3, the device for use in a data testing environment of Example 2 is disclosed, wherein the signal property is at least one of a change in amplitude of the signal, a change in frequency of the signal, a change in phase of the signal, or any combination thereof.

In Example 4, the device for use in a data testing environment of any one of Examples 1 to 3 is disclosed, wherein the first state has a first state duration, and the second state has a second state duration, and wherein determining the timing of the data transmission opportunity comprises determining at least one of the first state duration or the second state duration.

In Example 5, the device for use in a data testing environment of any one of Examples 1 to 4 is disclosed, wherein the one or more processors are further configured to determine a timing of the data transmission trigger based on the received electric signal, and to not send data during the determined timing of the data transmission trigger.

In Example 6, the device for use in a data testing environment of Example 5 is disclosed, wherein the one or more processors are further configured to stop sending data substantially coincident with a beginning of the transmission trigger, according to the determined timing.

In Example 7, the device for use in a data testing environment of any one of Examples 1 to 6 is disclosed, wherein the one or more processors are further configured to determine a candidate timing for the first state and the second state, and to send the candidate timing to the node.

In Example 8, the device for use in a data testing environment of Example 7 is disclosed, wherein the one or more processors determine the candidate timing according to at least one of a processor speed of the device for use in a data testing environment and/or a buffer capacity of the device for use in a data testing environment.

In Example 9, the device for use in a data testing environment of any one of Example 1 to 8 is disclosed, wherein the node is an input/output interface, configured to be connected to an external device.

In Example 10, the device for use in a data testing environment of Example 9 is disclosed, wherein the input/output interface is configured to be connected to the external device via a single wire.

In Example 11, the device for use in a data testing environment of any one of Examples 1 to 10 is disclosed, wherein the electrical signal and the data are transmitted on the same wire.

In Example 12, the device for use in a data testing environment of Example 11 is disclosed, wherein the data is sent according to a Single Wire Interface protocol.

In Example 13, the device for use in a data testing environment of any one of Examples 1 to 12 is disclosed, wherein the one or more processors are configured to send data only substantially coincident to a trailing end of the first state.

In Example 14, the device for use in a data testing environment of any one of Examples 1 to 13 is disclosed, wherein the data transfer device is a device under test.

In Example 15, the device for use in a data testing environment of any one of Examples 1 to 14 is disclosed, wherein the node is connected to an Automatic Testing Equipment.

In Example 16, a method of device testing is disclosed comprising receiving from a node an electrical signal, the electrical signal alternating between at least a first state and a second state, the first state representing a data transmission trigger and the second state representing a data transmission opportunity; determining a timing of the data transmission opportunity based on the received electrical signal; and sending data to the node during the data transmission opportunity in response to receiving the data transmission trigger.

In Example 17, the method of device testing of Example 16 is disclosed, wherein the first state and the second state are differentiated by a change in a signal property of the electrical signal.

In Example 18, the method of device testing of Example 17 is disclosed, wherein the signal property is at least one of a change in amplitude of the signal, a change in frequency of the signal, a change in phase of the signal, or any combination thereof.

In Example 19, the method of device testing of any one of Examples 16 to 18 is disclosed, wherein the first state has a first state duration, and the second state has a second state duration, and wherein determining the timing of the data transmission opportunity comprises determining at least one of the first state duration or the second state duration.

In Example 20, the method of device testing of any one of Examples 16 to 19 is disclosed, further comprising determining a timing of the data transmission trigger based on the received electric signal, and not sending data during the determined timing of the data transmission trigger.

In Example 21, the method of device testing of Example 20 is disclosed, further comprising stopping sending data substantially coincident with a beginning of the transmission trigger, according to the determined timing.

In Example 22, the method of device testing of any one of Examples 16 to 21 is disclosed, further comprising determining a candidate timing for the first state and the second state, and sending the candidate timing to the node.

In Example 23, the method of device testing of Example 22 is disclosed, further comprising determining the candidate timing according to at least one of a processor speed of and/or a buffer capacity.

In Example 24, the method of device testing of any one of Examples 16 to 23 is disclosed, wherein the node is an input/output interface, configured to be connected to an external device.

In Example 25, the method of device testing of Example 24 is disclosed, wherein the input/output interface is configured to be connected to the external device via a single wire.

In Example 26, the method of device testing of any one of Examples 16 to 26 is disclosed, wherein the electrical signal and the data are transmitted on the same wire.

In Example 27, the method of device testing of Example 26 is disclosed, wherein the data is sent according to a Single Wire Interface protocol.

In Example 28, the method of device testing of any one of Examples 16 to 27 is disclosed, wherein the one or more processors are configured to send data only substantially coincident to a trailing end of the first state.

In Example 29, one or more non-transient computer readable media is disclosed comprising instructions to cause one or more processors to perform the method of any one of Examples 16 to 29.

In Example 30, a system for use in a data testing environment is disclosed comprising: a test device, comprising: one or more processors, configured to send an electrical signal, the electrical signal alternating between at least a first state and a second state; the first state representing a data transmission trigger and the second state representing a data transmission opportunity; a device to be tested, comprising: a node, to connect the device to be tested to the testing device; one or more processors, the one or more processors configured to: receive from the node the electrical signal; determine a timing of the data transmission opportunity based on the received electrical signal; and send data to the testing device during the data transmission opportunity in response to receiving the data transmission trigger.

In Example 31, the system of Example 30 is disclosed is disclosed, wherein the first state and the second state are differentiated by a change in a signal property of the electrical signal.

In Example 32, the system of Example 31 is disclosed, wherein the signal property is at least one of a change in amplitude of the signal, a change in frequency of the signal, a change in phase of the signal, or any combination thereof.

In Example 33, the system of any one of Examples 30 to 32 is disclosed, wherein the first state has a first state duration, and the second state has a second state duration, and wherein determining the timing of the data transmission opportunity comprises determining at least one of the first state duration or the second state duration.

In Example 34, the system of any one of Examples 30 to 33 is disclosed, wherein the one or more processors of the device to be tested are further configured to determine a timing of the data transmission trigger based on the received electric signal, and to not send data during the determined timing of the data transmission trigger.

In Example 35, the system of Example 34 is disclosed, wherein the one or more processors of the device to be tested are further configured to stop sending data substantially coincident with a beginning of the transmission trigger, according to the determined timing.

In Example 36, the system of any one of Examples 30 to 35 is disclosed, wherein the one or more processors of the device to be tested are further configured to determine a candidate timing for the first state and the second state, and to send the candidate timing to the node.

In Example 37, the system of Example 36 is disclosed, wherein the one or more processors of the device to be tested are configured to determine the candidate timing according to at least one of a processor speed of the device to be tested and/or a buffer capacity of the device to be tested.

In Example 38, the system of any one of Examples 30 to 37 is disclosed, wherein the electrical signal and the data are transmitted on the same wire.

In Example 39, the system of Example 38 is disclosed, wherein the data is sent according to a Single Wire Interface protocol.

In Example 40, the system of any one of Examples 30 to 39 is disclosed, wherein the one or more processors are configured to send data only substantially coincident to a trailing end of the first state.

In Example 41, the system of any one of Examples 30 to 40 is disclosed, wherein the data transfer device is a device under test.

In Example 42, a device for use in a data testing environment is disclosed comprising: a node, to connect the device to a testing device; one or more processors, the one or more processors configured to: receive from the node an electrical signal, the electrical signal alternating between at least a first state and a second state, the first state representing a data transmission trigger and the second state representing a data transmission opportunity; determine a timing of at least one of the first state or the second state based on the received electrical signal; and send data to the node during a timing corresponding to the second state in response to receiving the signal according to the first state.

In Example 43, a device for use in a data testing environment is disclosed comprising: a node; one or more processors, configured to operate according to a listening mode or a transmitting mode; wherein the one or more processors are further configured to: receive from the node a transmission trigger of a first duration according to the listening mode, the transmission trigger representing a prompt to send data in a subsequent transmission period; send data to the node during the transmission period in response to receiving the first signal portion.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

The invention claimed is:

1. A device of a data testing environment, comprising:
   a node configured to connect the device of the data testing environment to a tester;
   one or more processors configured to:
      receive from the node an electrical signal alternating between at least a first state and a second state, the first state representing a data transmission trigger and the second state representing a data transmission opportunity;
      determine a timing of the data transmission opportunity based on the received electrical signal; and
      send data to the node during the data transmission opportunity in response to receiving the data transmission trigger.

2. The device of claim 1, wherein the first state and the second state are differentiated by a change in a signal property of the electrical signal.

3. The device of claim 2, wherein the signal property is at least one of a change in amplitude of the signal, a change in frequency of the signal, a change in phase of the signal, or any combination thereof.

4. The device of claim 1, wherein the first state has a first state duration, the second state has a second state duration, and the determining the timing of the data transmission opportunity comprises determining the first state duration or the second state duration.

5. The device of claim 1, wherein the one or more processors are further configured to determine a timing of the data transmission trigger based on the received electric signal, and to not send data during the determined timing of the data transmission trigger.

6. The device of claim 1, wherein the one or more processors are further configured to determine a candidate timing for the first state and the second state, and to send the candidate timing to the node, and wherein the candidate timing is determined according to a processor speed of the device or a buffer capacity of the device.

7. The device of claim 1, wherein the node is an input/output interface configured to be connected to an external device.

8. The device of claim 1, wherein the electrical signal and the data are transmitted on a same wire.

9. The device of claim 1, wherein the one or more processors are configured to send data only substantially coincident to a trailing end of the first state.

10. The device of claim 1, wherein the device is a device under test.

11. The device of claim 1, wherein the node is connected to an Automatic Testing Equipment.

12. A method of device testing, comprising:
    receiving from a node an electrical signal, the electrical signal alternating between at least a first state and a second state, the first state representing a data transmission trigger and the second state representing a data transmission opportunity;
    determining a timing of the data transmission opportunity based on the received electrical signal; and
    sending data to the node during the data transmission opportunity in response to receiving the data transmission trigger.

13. The method of device testing of claim 12, wherein the first state and the second state are differentiated by a change in a signal property of the electrical signal.

14. The method of device testing of claim 13, wherein the signal property is at least one of a change in amplitude of the signal, a change in frequency of the signal, a change in phase of the signal, or any combination thereof.

15. The method of device testing of claim 12, wherein the first state has a first state duration, and the second state has a second state duration, and wherein the determining the timing of the data transmission opportunity comprises determining at least one of the first state duration or the second state duration.

16. The method of device testing of claim 12, further comprising determining a timing of the data transmission trigger based on the received electric signal, and not sending data during the determined timing of the data transmission trigger.

17. The method of device testing of claim 12, further comprising determining a candidate timing for the first state and the second state, and sending the candidate timing to the node, wherein the candidate timing is determined according to a processor speed or a buffer capacity of the device.

18. The method of device testing of claim 12, wherein the node is an input/output interface configured to be connected to an external device.

19. One or more non-transient computer readable media comprising instructions to cause one or more processors to perform the method of claim 12.

20. A system of a data testing environment comprising:
a tester, comprising:
   one or more processors configured to send an electrical signal alternating between at least a first state and a second state, the first state representing a data transmission trigger and the second state representing a data transmission opportunity;
a device to be tested, comprising:
   a node configured to connect the device to be tested to the tester;
   one or more processors configured to:
      receive from the node the electrical signal;
      determine a timing of the data transmission opportunity based on the received electrical signal; and
      send data to the tester during the data transmission opportunity in response to receiving the data transmission trigger.

* * * * *